(12) United States Patent
Ahn et al.

(10) Patent No.: US 9,667,190 B2
(45) Date of Patent: May 30, 2017

(54) DEVICE FOR CONTROLLING SAMPLE TEMPERATURE DURING PHOTOELECTRIC MEASUREMENT AND SOLAR CELL MEASUREMENT DEVICE USING SAME

(71) Applicant: KOREA INSTITUTE OF ENERGY RESEARCH, Daejeon (KR)

(72) Inventors: SeoungKyu Ahn, Daejeon (KR); Kyung Hoon Yoon, Daejeon (KR); Jae Ho Yun, Daejeon (KR); Jun Sik Cho, Daejeon (KR); SeJin Ahn, Daejeon (KR); Jihye Gwak, Daejeon (KR); Kee Shik Shin, Daejeon (KR); Kihwan Kim, Daejeon (KR); Joo Hyung Park, Daejeon (KR); Young Joo Eo, Daejeon (KR); Jin Su Yoo, Seoul (KR); Ara Cho, Seoul (KR)

(73) Assignee: KOREA INSTITUTE OF ENERGY RESEARCH (KR)

( * ) Notice: Subject to any disclaimer, the term of this patent is extended or adjusted under 35 U.S.C. 154(b) by 0 days.

(21) Appl. No.: 14/402,834

(22) PCT Filed: Aug. 8, 2014

(86) PCT No.: PCT/KR2014/007369
§ 371 (c)(1),
(2) Date: Nov. 21, 2014

(87) PCT Pub. No.: WO2016/017846
PCT Pub. Date: Feb. 4, 2016

(65) Prior Publication Data
US 2016/0308490 A1    Oct. 20, 2016

(30) Foreign Application Priority Data
Jul. 31, 2014    (KR) .................. 10-2014-0098447

(51) Int. Cl.
*H02S 50/15* (2014.01)
*H02S 50/00* (2014.01)
(Continued)

(52) U.S. Cl.
CPC .......... *H02S 50/15* (2014.12); *G01R 31/2877* (2013.01); *G05D 23/1917* (2013.01); *H02S 50/00* (2013.01); *H02S 50/10* (2014.12)

(58) Field of Classification Search
CPC ......... H01L 21/67109; H01L 21/67115; H01L 21/67248; H01L 21/324; H01L 21/67017;
(Continued)

(56) References Cited

U.S. PATENT DOCUMENTS 5,754,620 A * 5/1998 Hossain ............... G01N 23/223
378/44
7,838,792 B2 * 11/2010 Tandou ............ H01L 21/67109
219/121.36
(Continued)

FOREIGN PATENT DOCUMENTS

| KR | 1020110023966 | 3/2011 |
|---|---|---|
| KR | 1020120096832 | 8/2012 |
| KR | 101281053 | 7/2013 |
| KR | 101292789 | 8/2013 |

OTHER PUBLICATIONS

Korean Office Action; 10-2014-0098447; Apr. 20, 2015 (7 Pages).
International Search Report (ISR) and Written Opinion; PCT/KR2014/007369; Apr. 16, 2015 (8 Pages).

*Primary Examiner* — Alesa Allgood
(74) *Attorney, Agent, or Firm* — Mark E. Bandy

(57) ABSTRACT

Disclosed herein is a device for controlling a sample temperature during photoelectric measurement of the sample. The device for controlling a sample temperature during photoelectric measurement of the sample includes: a sample stage to which a measurement target sample is fixed; a cooling unit for cooling the sample by injecting air; and a
(Continued)

temperature measuring unit having a thermometer that measures a temperature of the sample. The device has an effect of easily controlling the temperature of a measurement target sample by employing a direct control method for a sample temperature, in which air or cooled air is injected to the sample.

18 Claims, 4 Drawing Sheets

(51) Int. Cl.
    *G01R 31/28*     (2006.01)
    *G05D 23/19*     (2006.01)
    *H02S 50/10*     (2014.01)

(58) Field of Classification Search
    CPC ........ H01L 21/67103; H01L 21/68714; G01R 31/2877
    See application file for complete search history.

(56) References Cited

U.S. PATENT DOCUMENTS

| | | | |
|---|---|---|---|
| 2001/0043314 A1* | 11/2001 | Ota | G03F 7/707 355/30 |
| 2005/0045104 A1* | 3/2005 | Arai | H01J 37/32082 118/724 |
| 2007/0081295 A1* | 4/2007 | Brillhart | H01L 21/67109 361/234 |
| 2008/0023147 A1* | 1/2008 | Yokogawa | H01J 37/32431 156/345.53 |
| 2009/0277883 A1* | 11/2009 | Tandou | H01J 37/32623 219/121.49 |
| 2011/0277556 A1* | 11/2011 | Peecock | G01L 5/0033 73/827 |
| 2012/0112062 A1* | 5/2012 | Novak | H01J 37/18 250/307 |
| 2012/0211486 A1* | 8/2012 | Kasai | H01L 21/67017 219/679 |

* cited by examiner

DEVICE FOR CONTROLLING SAMPLE TEMPERATURE DURING PHOTOELECTRIC MEASUREMENT AND SOLAR CELL MEASUREMENT DEVICE USING SAME

TECHNICAL FIELD

The present invention relates generally to a device for controlling a sample temperature during photoelectric measurement of the sample and a solar cell measurement device using the same. More particularly, the present invention relates to a device for maintaining a constant temperature of a measurement target sample in a procedure for measuring photoelectric characteristics, and a solar cell measurement device for maintaining a constant temperature of a solar cell sample using the same.

BACKGROUND ART

Generally, a solar cell is a semiconductor device to generate electric power from sunlight. Spectral responsivity and indicators such as open circuit voltage, short circuit current, conversion efficiency, maximum output, and the like are main factors determining solar cell performance and selling price. These performance indicators are determined by measuring photoelectric characteristics like current-voltage curve or spectral responsivity, which a solar cell outputs, under the condition of maintaining a constant device temperature ($25\pm1°$ C.) after exposing the solar cell to light having a specific spectrum (AM 1.5 G) and photo-irradiation intensity (1 sun=100 mW/cm$^2$) that International Standard provides, and the aforementioned test condition is called Standard Test Condition (STC).

In this case, a conventional measurement device for current-voltage curve or spectral responsivity of a solar cell used an indirect method for controlling a sample temperature, which controls a sample temperature by controlling a temperature of a sample stage to which a measurement target solar cell is fixed, to maintain a temperature of a solar cell device at a value similar to STC conditions during measurement.

In the case of a general crystalline silicon solar cell whose thermal conductivity is relatively good, and a thin film solar cell using thin glass substrates or metal substrates, the indirect method for controlling a sample temperature is fully efficient because an effective heat exchange between a sample stage and a sample is possible.

However, in the case of a thin film solar cell using thick glass substrates or a solar cell that has to use an additional jig for measurement, because heat exchange between a sample stage and a sample is not effective, a temperature of the solar cell sample increases steeply when it is exposed to light, and it is not easy to maintain the temperature of the measurement target solar cell at a value similar to STC conditions. Also, in the case of a dye-sensitized solar cell, which requires a relatively long time for measurement due to slow spectral response time since it should be exposed to light for a longer period of time for measurement than other types of solar cells, shortcomings of an indirect method for controlling a temperature stand out.

Furthermore, as an accurate measurement is difficult due to the sample temperature increase caused by photo-irradiation or other reasons in the procedure of measuring photoelectric characteristics of other manufactured samples besides a solar cell. Efforts to solve the problem are ongoing.

DISCLOSURE

Technical Problem

Accordingly, the present invention has been made keeping in mind the above problems occurring in the related art, and an object of the present invention is, departing from the indirect method for controlling a sample temperature, to provide a device for controlling a sample temperature that may be applied to devices for measuring various photoelectric characteristics, and a solar cell measurement device using the same.

Technical Solution

In order to accomplish the above object, the present invention provides a device for controlling a sample temperature during photoelectric measurement of the sample, including: a sample stage to which a measurement target sample is fixed; a cooling unit for cooling the sample by injecting air; and a temperature measuring unit having a thermometer to measure the temperature of the sample.

Target samples whose temperature is controlled by the device may include not only a sample whose temperature increases by the photo-irradiation involved in the measurement process but also other kinds of samples whose temperature also increases during measurement.

In this case, it is desirable that the cooling unit includes: an air compressor for generating compressed air, and a compressed air injector connected to the air compressor for injecting the compressed air. Also, it may further include a compressed air cooler connected to the air compressor for cooling the compressed air.

The device may include a first stand for connecting the compressed air injector. The compressed air injector is connected to the first stand using a first connection element. Also, as the first connection element or the compressed air injector has mobility in one or more directions, it is possible to control a direction to which the compressed air is injected. Accordingly, in order to inject the compressed air to the proper position of a sample, a direction of the first connection element or compressed air injector may be controlled.

Also, if the thermometer is a non-contact thermometer, and the device includes a second stand to which the thermometer is connected, it is possible to measure a sample temperature without direct effect to the measurement target sample. The thermometer is connected to the second stand using a second connection element. As the second connection element or the thermometer has mobility in one or more directions, an orientation which a thermometer measures for may be controlled. Accordingly, to measure a temperature of the proper position, an orientation of the second connection element or thermometer may be controlled. The most common type of a non-contact thermometer is a radiation thermometer, which measures a temperature of a target object by measuring radiant energy from the object.

Also, the device may further include a control unit for controlling an amount of air injected or generated from the cooling unit according to a temperature measured in the temperature measuring unit to enhance a controlling effect for the sample temperature.

On the other hand, it is desirable that the sample stage has cooling equipment for cooling the sample stage and a contact temperature sensor for measuring a temperature of the sample stage. To arrange cooling equipment and a temperature sensor for the sample stage facilitates an indirect control of the sample temperature with a direct temperature control using injecting air. The cooling equipment for the sample stage may use water cooling or thermoelectric cooling.

The sample stage may be supported by a supporting unit, which is in contact with at least one part of the sample stage. The size of the sample stage is properly configured by having the additional supporting unit. Concretely, the supporting unit may support a bottom surface of the sample stage, support a side surface and bottom surface of it except for a top surface, or only support a side surface of it.

Additionally, a solar cell measurement device for achieving the above object includes a light source unit having a light source that emits light; a cooling unit for cooling the sample by injecting air; and a temperature measuring unit having a thermometer for measuring the sample temperature, the sample being one selected from among a solar battery unit cell, a solar battery module, and a sub-assembly of the solar battery cell.

The solar cell measurement device includes devices for measuring photoelectric characteristics of a solar cell such as a device for measuring current-voltage curve or spectral responsivity of a solar cell sample. Also, all devices measuring an electric and electronic characteristics with lighting on a solar cell may correspond to the solar cell measurement device, and it is obvious for those skilled in the art that each measurement device may be comprised of a number of components besides the device for maintaining a sample temperature during the photoelectric measurement and the light source unit above described. However, because general components of each measurement device can be used without a specific limit, a detailed description about those will be omitted.

The solar cell measurement device may measure photoelectric characteristics of a solar cell sample without a temperature increase caused by the light emitted from the light source unit. Also, the measurement target sample may include a general solar battery unit cell, a sub-assembly, a photovoltaic module, and the like, and thus, "solar cell" will be used to represent all the aforementioned samples hereinafter.

A conventional solar cell measurement device does not use an additional device for controlling a sample temperature during the measurement or only uses an indirect control method for a sample temperature, which controls a temperature of a sample stage to which a measurement target solar cell is fixed. Accordingly, in the case of a thin film solar cell using thick glass substrates, a solar cell that has to use an additional jig for measurement, or a solar cell requiring a long time for measurement due to a slow spectral response time, it is difficult to maintain a temperature of the measurement target solar cell at a value similar to STC conditions during measurement.

On the contrary, the present invention facilitates controlling a temperature of a measurement target solar cell during the performance evaluation process of the solar cell, to a value similar to STC conditions by only using a direct control method for a sample temperature or by using the direct control method with an indirect control method, the direct control method injecting compressed air generated by an air compressor to a solar cell after cooling the compressed air by a cooler or without cooling.

The light source satisfies solar simulated illumination of AM 1.5 G standard spectra and 100 mW/cm$^2$ of irradiation intensity, used for a solar cell performance evaluation, or it may be a light source satisfying similar conditions. Typically, it may be the one selected from among a xenon lamp, halogen lamp, LED, a combination thereof, or a broadband light source.

Except that a measurement target sample is a solar cell, the solar cell measurement device may apply a configuration of a device for maintaining a sample temperature during photoelectric measurement, for the most part excluding a light source unit that provides a light for photovoltaic power generation. Accordingly, the detailed description will be omitted.

Advantageous Effects

According to the present invention, a device for controlling a sample temperature during measurement of photoelectric characteristics of the sample has an effect of easily controlling a temperature of a measurement target sample by employing a direct control method for a sample temperature, in which air or cooled air is injected to the sample.

Also, a device for controlling a sample temperature during measurement of photoelectric characteristics of the sample according to the present invention shows an excellent control effect for a sample temperature by using the direct control method for a sample temperature with an indirect control method that controls a temperature of a sample stage.

Furthermore, the solar cell measurement device according to the present invention enables easy maintenance of a temperature of a sample solar cell at STC conditions. Particularly, it may be applied to the measurement of the various solar cells including a thin film solar cell using a thick glass substrate, a solar cell that has to use an additional jig for measurement, a solar cell requiring a relatively long time for measurement due to a slow spectral response time, etc., as well as general crystalline silicon solar cells.

Figure 1:
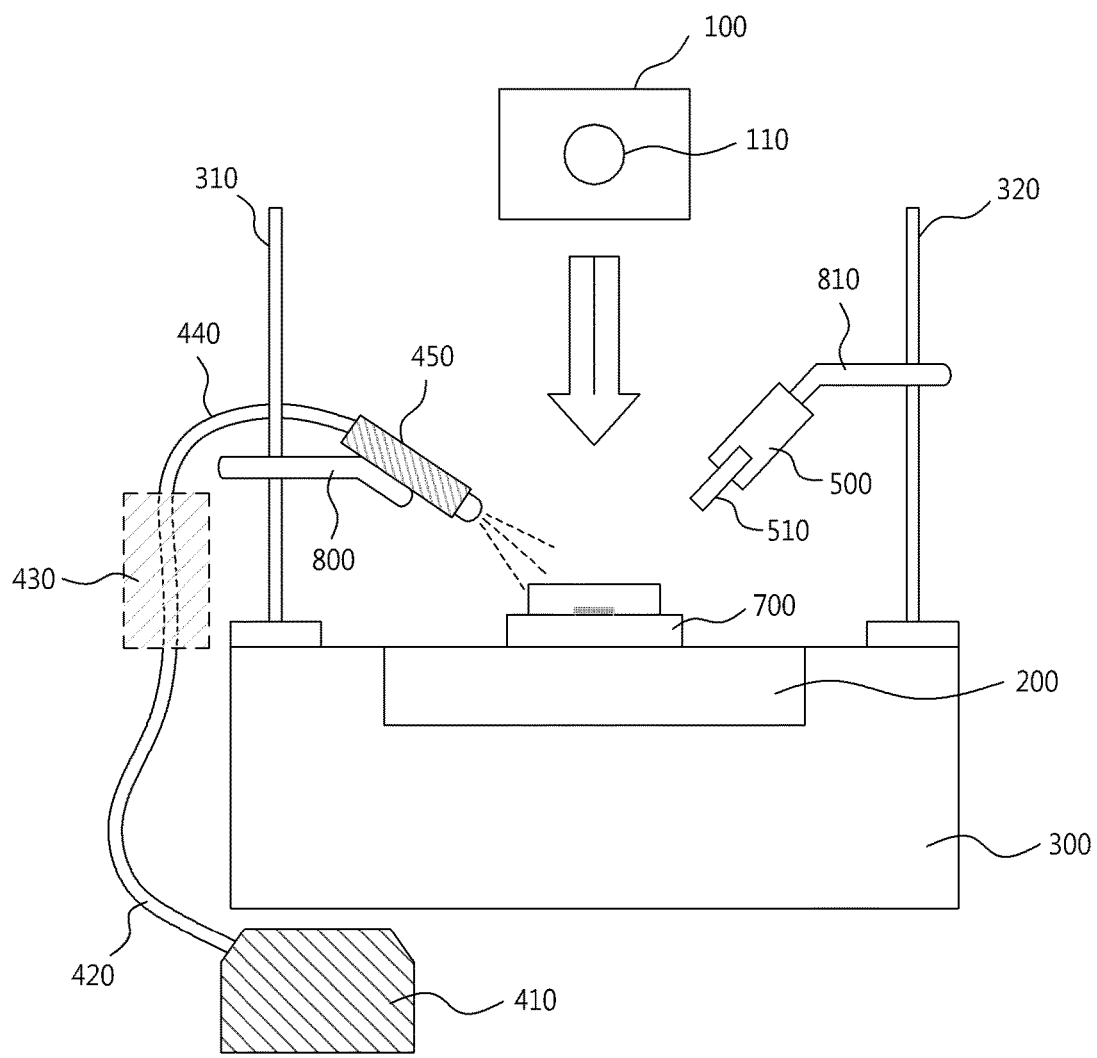
FIG. 1 is a simplified diagram for illustrating the main parts of a solar cell measurement device according to an embodiment of the present invention.

<Description of the Reference Numerals in the Drawings>

| | |
|---|---|
| 100: light source unit | 430: compressed air cooler |
| 110: light source | |
| 440: the second compressed air discharge hose | |
| 200: sample stage | 450: compressed air injector |
| 300: supporting unit | 500: temperature measuring unit |
| 310: the first stand | 510: thermometer |
| 320: the second stand | 600: control unit |
| 400: cooling unit | 700: solar cell |
| 410: air compressor | 800: the first connection element |
| 420: the first compressed air discharge hose | |
| 810: the second connection element | |

BEST MODE

The preferred embodiment of the present invention will now be described in detail referring to the accompanying drawings. The following embodiment may be modified to many different forms and is not to be construed as the limit of the present invention. The embodiment of the present invention is provided to clearly deliver technical ideas of the present invention to those skilled in the art.

FIG. 1 is a simplified diagram to illustrate the main parts of a solar cell measurement device according to an embodiment of the present invention.

Referring to FIG. 1, a solar cell measurement device according to an embodiment of the present invention includes a light source unit 100, a sample stage 200, a supporting unit 300, a cooling unit 400, and a temperature measuring unit 500.

The light source unit 100 includes a light source 110 that emits lights. The light source 110 satisfies the condition of AM 1.5 G standard solar spectra and 100 mW/cm$^2$ of irradiation intensity, used for the performance evaluation of a solar cell, or may be a light source satisfying the similar conditions. Generally, a xenon lamp, halogen lamp, LED, or multiple light sources combining the aforementioned is recommended.

The sample stage 200 is located under the light source unit 100, and a solar cell 700, which is a measurement target, is fixed to an upper part of the sample stage 200 using a separate fixing element. The sample stage may just function as fixing a solar cell sample, but may have a temperature sensor (not illustrated) and cool the sample stage 200 to which the solar cell 700 is fixed, using water cooling or thermoelectric cooling according to a temperature measured by the temperature sensor.

A supporting unit 300 is located under the sample stage 200 and built longer than the sample stage 200 widthwise, to support the sample stage 200. A first stand 310 and a second stand 320 are placed on both sides of the upper part of the supporting unit 300 where the sample stage is not located.

However, a shape of the supporting unit is not limited to the above description. It may be attached to a part of the sample stage, or have the same length as the sample stage widthwise with placing the stands on one side or both sides of the upper part of the sample stage. Also, as occasion demands, it may be changed to remove the supporting unit and place the stands on one side or both sides of the upper part of the sample stage.

The first stand 310 and second stand 320, placed oppositely on both sides of the upper part of the supporting unit, are in a shape of a rod, which may be extended longitudinally and rotate on its axis. However, it is not limited to the above description, and may be modified to various forms extendable in length direction and rotatable on its axis.

The cooling unit 400 is placed in one side of the supporting unit 300 and configured to include: an air compressor 410 for generating compressed air; a first compressed air discharge hose 420 for discharging compressed air generated from the air compressor 410; a compressed air cooler 430 connected to the first compressed air discharge hose 420 for cooling the compressed air; a second compressed air discharge hose 440 connected to the compressed air cooler 430 for discharging the compressed air that has been cooled; and a compressed air injector 450 connected to the second compressed air discharge hose 440 for injecting the compressed air that has been cooled.

The compressed air injector 450 is connected to a first connection element 800, which is connected to the first stand 310, and may rotate in a horizontal or vertical direction. A nozzle (not illustrated) of the compressed air injector 450 aims at the solar cell 700, and the compressed air that has been cooled, is injected through the nozzle.

The temperature measuring unit 500 has a thermometer 510 for measuring a temperature of a solar cell, and the thermometer 510 is connected to a second connection element 810, which is connected to the second stand 320. It is desirable that the thermometer 510 is a non-contact radiation thermometer.

Figure 2:
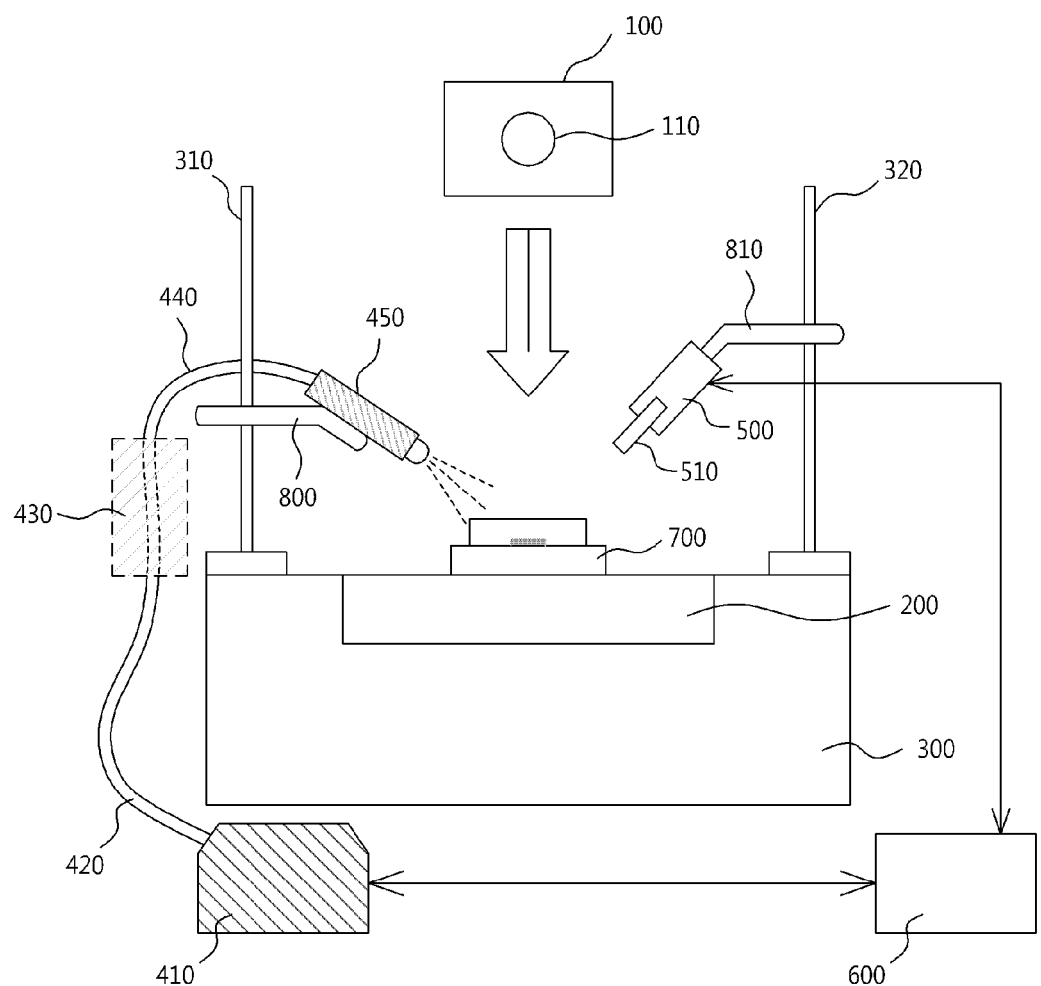
FIG. 2 is a simplified diagram for illustrating the main parts of a solar cell measurement device according to another embodiment of the present invention.

FIG. 2 is a simplified diagram to illustrate the main parts of a solar cell measurement device according to another embodiment of the present invention.

Referring to FIG. 2, a solar cell measurement device according to another embodiment of the present invention further includes a control unit 600.

Figure 3:
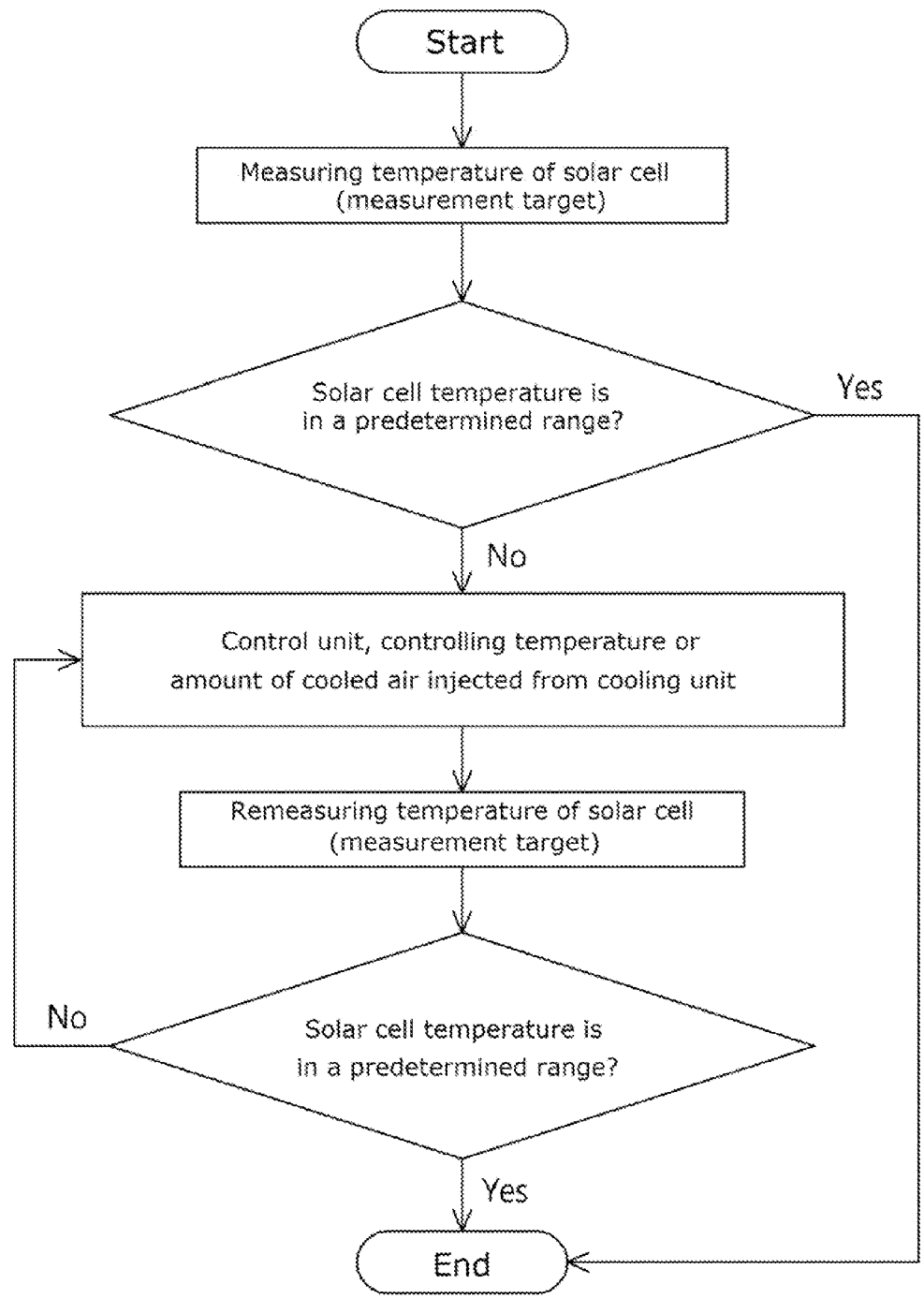
FIG. 3 is a flowchart for illustrating a temperature control process of a control unit in a solar cell measurement device of FIG. 2.

The control unit 600 receives temperature data of the solar cell 700 as an input from the temperature measuring unit 500 at regular intervals. If a temperature of the solar cell 700 is higher than the predetermined temperature range (for example, a standard temperature at STC), the control unit sends the cooling unit 400 instructions for increasing an amount of compressed air that has been cooled until the temperature of the solar cell 700 reaches the predetermined temperature range. On the contrary, if the temperature of the solar cell 700 is lower than the predetermined temperature range, the control unit sends the cooling unit 400 instructions for decreasing or stopping an amount of compressed air that has been cooled (refer to FIG. 3).

However, instructions from the control unit 600 are not limited to controlling an amount of compressed air that has been cooled, but may be modified to various methods including controlling an amount of compressed air to be generated by the air compressor 410 or controlling a cooling temperature of the cooler 430.

Duplicated contents between the solar cell measurement device of FIGS. 1 and 2 will be omitted for conciseness of the specification.

Figure 4:
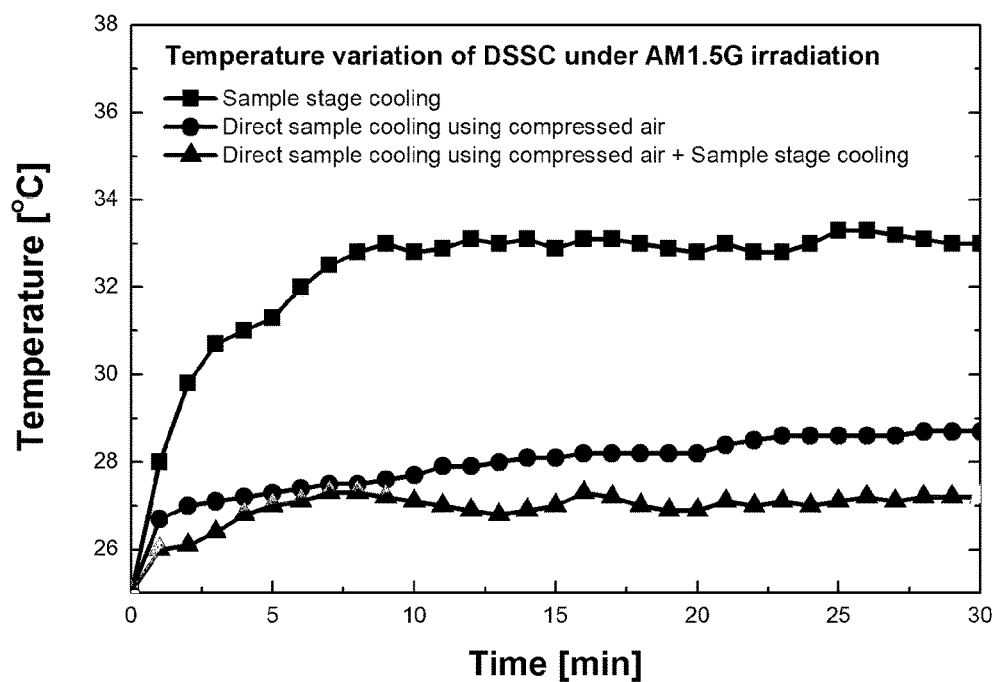
FIG. 4 is a graph showing a variance in temperature of a measurement target solar cell according to time, when using an indirect control method, using a direct control method, and using both an indirect control method and direct control method, respectively.

FIG. 4 is a graph illustrating a variance in temperature of a measurement target solar cell according to the elapsed time, when using an indirect control method, using a direct control method, and using both an indirect control method and direct control method. A dye-sensitized solar cell manufactured based on FTO (fluorine-doped tin oxide) glass with thickness of 2.2 mm is used as the measurement target solar cell, and measurement is performed under the condition that light of a spectrum similar to AM 1.5 G is illuminated to the solar cell with the intensity of 100 mW/cm$^2$.

If an indirect control method through sample stage cooling (sample stage cooling in FIG. 4) is only used, a temperature of a solar cell rises steeply up to 31° C. after 5 minutes from the start of the measurement, and the temperature is maintained at near 33° C. after 10 minutes.

If a direct control method through direct solar cell cooling using compressed air (direct sample cooling using compressed air in FIG. 4) is only used, a temperature of a solar cell rises steeply up to 27° C. after 1 minute from the start of the measurement, and the temperature is maintained at near 28° C. after that.

If both a direct control method and indirect control method, through the sample stage cooling and direct solar cell cooling using compressed air (direct sample cooling using compressed air+sample stage cooling in FIG. 4), are used at the same time, a temperature of a solar cell rises up to 26° C. after 1 minute from the start of the measurement, and the temperature is maintained at near 27° C. after that.

Referring to FIG. 4, using the direct control method or using both the direct and indirect control method has an effect to maintain a solar cell temperature at a similar value to a standard temperature specified by STC even after a considerable measurement time has passed, compared to the case of only using the indirect control method.

As described above, disclosed is an embodiment in which a device for controlling a sample temperature during measurement of photoelectric characteristics of a sample is installed as a solar cell measurement device, and it is obvious to those skilled in the art that it may be applied to all the fields in which photo-irradiation or other reasons cause a sample temperature to increase in the procedure of measuring photoelectric characteristics of the manufactured sample. Also, the extent of the rights for the device for controlling a sample temperature while measuring photoelectric characteristics of the sample should be understood by the accompanying claims, not by the embodiment described above.

The invention claimed is:

1. A device for controlling a sample temperature during photoelectric measurement of the sample, comprising:
   a sample stage to which a sample is fixed, the sample being a measurement target;
   a cooling unit for cooling the sample by injecting air, wherein the cooling unit comprises an air compressor for generating compressed air and a compressed air injector connected to the air compressor for injecting compressed air;
   a temperature measuring unit having a thermometer to measure a temperature of the sample; and
   a first stand to which the compressed air injector is connected,
   wherein the compressed air injector is connected to the first stand using a first connection element, and the first connection element or the compressed air injector has mobility in one or more directions.

2. The device of claim 1, wherein the cooling unit comprises a compressed air cooler, connected to the air compressor, for cooling compressed air.

3. The device of claim 1, further comprising a control unit for controlling an amount of air injected or generated from the cooling unit according to a temperature measured in the temperature measuring unit.

4. The device of claim 1, further comprising a second stand to which the thermometer is connected, wherein the thermometer is a non-contact thermometer.

5. The device of claim 4, wherein the thermometer is connected to the second stand using a second connection element, and the second connection element or the thermometer has mobility in one or more directions.

6. The device of claim 1, wherein the sample stage has cooling equipment to cool the sample stage.

7. The device of claim 6, wherein the cooling equipment cools the sample stage using water cooling or thermoelectric cooling.

8. The device of claim 6, wherein the sample stage has a contact temperature sensor to measure a temperature of the sample stage.

9. The device of claim 6, wherein the sample stage is supported by a supporting unit, which contacts with at least one part of the sample stage.

10. A solar cell measurement device, comprising:
    a light source unit having a light source that emits light;
    a sample stage to which a sample is fixed, the sample being a measurement target;
    a cooling unit for cooling the sample by injecting air; and
    a temperature measuring unit having a thermometer to measure a temperature of the sample, wherein the sample is one selected from among a solar battery unit cell, a solar battery module, and a sub-assembly of a solar battery cell.

11. The solar cell measurement device of claim 10, wherein the light source is one selected from among a xenon lamp, halogen lamp, LED, and a combination thereof.

12. The solar cell measurement device of claim 10, further comprising a stand to which the thermometer is connected, wherein the thermometer is a non-contact thermometer.

13. The solar cell measurement device of claim 10, further comprising a control unit for controlling an amount of air injected or generated from the cooling unit according to a temperature measured in the temperature measuring unit.

14. The solar cell measurement device of claim 10, wherein the sample stage has a contact temperature sensor to measure a temperature of the sample that is in contact with the sample stage and cooling equipment to cool the sample that is in contact with the sample stage.

15. The solar cell measurement device of claim 10, wherein the cooling unit comprises:
    an air compressor for generating compressed air; and
    a compressed air injector, connected to the air compressor, for injecting compressed air.

16. The solar cell measurement device of claim 15, wherein the cooling unit comprises a compressed air cooler, connected to the air compressor, for cooling compressed air.

17. The solar cell measurement device of claim 15, further comprising a stand to which the compressed air injector is connected.

18. A device for controlling a sample temperature during photoelectric measurement of the sample, comprising:
    a sample stage to which a sample is fixed, the sample being a measurement target;
    a cooling unit for cooling the sample by injecting air;
    a temperature measuring unit having a thermometer to measure a temperature of the sample; and
    a stand to which the thermometer is connected, wherein the thermometer is a non-contact thermometer,
    wherein the thermometer is connected to the stand using a connection element, and the connection element or the thermometer has mobility in one or more directions.

* * * * *